(12) United States Patent
Wang (10) Patent No.: US 11,050,392 B2
(45) Date of Patent: Jun. 29, 2021

(54) BIAS DEVICE

(71) Applicant: RichWave Technology Corp., Taipei (TW)

(72) Inventor: Yi-Fong Wang, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/691,497

(22) Filed: Nov. 21, 2019

(65) Prior Publication Data

US 2020/0395898 A1    Dec. 17, 2020

(30) Foreign Application Priority Data

Jun. 13, 2019   (TW) .................................. 108120526

(51) Int. Cl.
*H03F 1/56* (2006.01)
*H03F 1/02* (2006.01)

(52) U.S. Cl.
CPC ............. *H03F 1/56* (2013.01); *H03F 1/0205* (2013.01); *H03F 2200/18* (2013.01); *H03F 2200/387* (2013.01); *H03F 2200/451* (2013.01)

(58) Field of Classification Search
CPC ........................................................ H03F 1/56
See application file for complete search history.

(56) References Cited

U.S. PATENT DOCUMENTS

| | | | |
|---|---|---|---|
| 6,333,677 B1 | 12/2001 | Dening | |
| 7,768,345 B2 * | 8/2010 | Aoki | ...................... H03F 1/0266 330/133 |
| 9,571,139 B2 | 2/2017 | Alon | |
| 9,768,738 B2 | 9/2017 | Honda | |
| 10,277,173 B1 * | 4/2019 | Hur | .......................... H03F 3/195 |
| 10,284,150 B2 | 5/2019 | Watanabe | |
| 2003/0201835 A1 | 10/2003 | Dening | |
| 2007/0052481 A1 | 3/2007 | Newman | |

(Continued)

FOREIGN PATENT DOCUMENTS

| CN | 1613178 A | 5/2005 |
|---|---|---|
| CN | 1633746 A | 6/2005 |

(Continued)

OTHER PUBLICATIONS

Wang, the specification, including the claims, and drawings in the U.S. Appl. No. 16/439,726, filed Jun. 13, 2019.

*Primary Examiner* — Patricia T Nguyen
(74) *Attorney, Agent, or Firm* — Winston Hsu (57) ABSTRACT

A bias device includes a transistor, a bias circuit, and an impedance unit. The transistor has a first terminal, a second terminal for providing a first bias voltage to an input terminal of an amplifier, and a control terminal. The bias circuit has a first terminal, a second terminal coupled to a first system voltage terminal for receiving a first system voltage, and a third terminal coupled to the control terminal of the first transistor for providing a second bias voltage to the control terminal of the first transistor. The impedance unit has a first terminal for receiving a first reference voltage, a second terminal coupled to the first terminal of the bias circuit. The first impedance unit adjusts the input impedance looking into the second terminal of the first transistor according to a frequency of a radio frequency signal received from the input terminal of the amplifier.

16 Claims, 10 Drawing Sheets

(56) References Cited

U.S. PATENT DOCUMENTS

| | | | |
|---|---|---|---|
| 2008/0238553 A1* | 10/2008 | Cho | H03F 1/32 |
| | | | 330/296 |
| 2014/0285268 A1* | 9/2014 | Tsutsui | H03F 1/0205 |
| | | | 330/296 |
| 2016/0197586 A1* | 7/2016 | Ripley | H03F 1/22 |
| | | | 330/296 |
| 2016/0344357 A1 | 11/2016 | Ho | |
| 2019/0089307 A1* | 3/2019 | Tanaka | H03F 3/21 |
| 2020/0099339 A1* | 3/2020 | Chen | H03F 3/45183 |

FOREIGN PATENT DOCUMENTS

| | | |
|---|---|---|
| CN | 102006015 B | 11/2012 |
| CN | 101997495 B | 11/2013 |
| CN | 106797204 A | 5/2017 |
| TW | I261413 | 9/2006 |

\* cited by examiner

FIG. 10 of the present invention.

BIAS DEVICE

CROSS REFERENCE TO RELATED APPLICATION

This application claims priority of Taiwan application No. 108120526, which was filed on Jun. 13, 2019, and is included herein by reference.

TECHNICAL FIELD

The present invention is related to a bias device, and more particularly, to a bias device capable of adjusting the impedance for maintaining linearity of an amplifier.

BACKGROUND

In wireless communication, since operating environment can change over time, transmission signals are usually amplified by amplifiers to improve the quality of transmission and reception of the wireless signals. Generally, the bias circuit is adopted to provide a proper bias condition for amplifiers, ensuring the gain and linearity of the amplifier can meet the requirement.

However, the amplifier may be used to amplify radio frequency (RF) signals of different frequencies/channels in some applications. In the prior art, the impedance of the bias circuit may have different frequency responses under different frequencies, so the bias circuit is not able to provide the corresponding impedance and bias voltages when the frequency of the RF signals received by the amplifier is changed. Therefore, the linearity of the amplifier will drop, causing transmission loss.

SUMMARY

One embodiment of the present invention discloses a bias device. The bias device includes a transistor, a bias circuit, and an impedance unit.

The transistor has a first terminal, a second terminal for providing a first bias voltage to an input terminal of an amplifier, and a control terminal. The bias circuit has a first terminal, a second terminal coupled to a first system voltage terminal for receiving a first system voltage, and a third terminal coupled to the control terminal of the first transistor for providing a second bias voltage to the control terminal of the first transistor. The impedance unit has a first terminal for receiving a first reference voltage, and a second terminal coupled to the first terminal of the bias circuit. The first impedance unit adjusts an input impedance looking into the second terminal of the first transistor according to a frequency of a radio frequency signal received from the input terminal of the amplifier.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
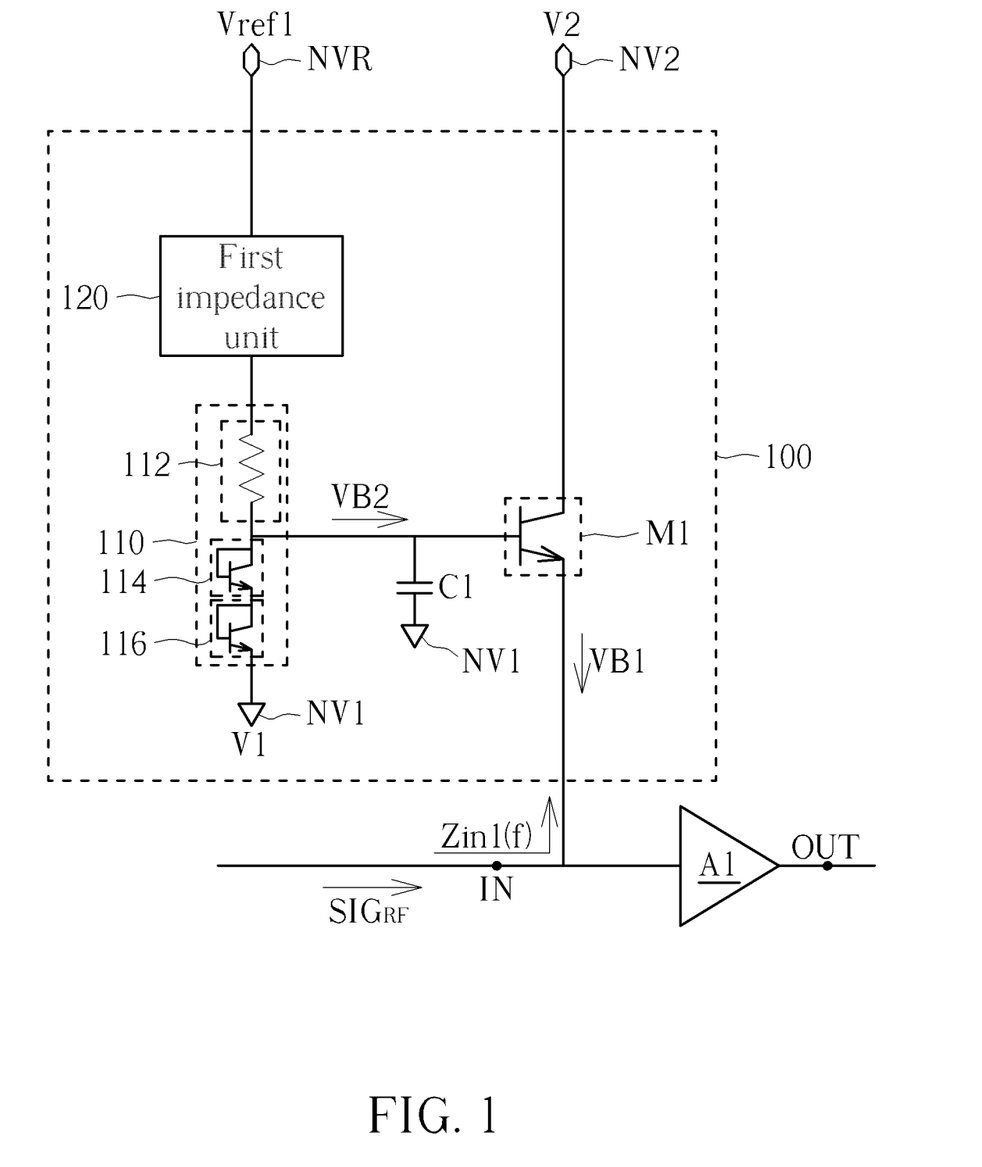
FIG. 1 shows a bias device according to one embodiment of the present invention.

FIG. 1 shows a bias device 100 according to one embodiment of the present invention. The bias circuit 100 includes a transistor M1, a bias circuit 110, and a first impedance unit 120. In FIG. 1, the bias device 100 can be used to provide the bias voltage required by the amplifier A1.

The transistor M1 has a first terminal, a second terminal for providing the bias voltage VB1 to the input terminal IN of the amplifier A1, and a control terminal. The bias circuit 110 has a first terminal, a second terminal coupled to the system voltage terminal NV1 for receiving the system voltage V1, and a third terminal coupled to the control terminal of the transistor M1 for providing the bias voltage VB2 to the control terminal of the transistor M1. The first impedance unit 120 has a first terminal coupled to the reference voltage terminal NVR for receiving the reference voltage Vref1, and a second terminal coupled to the first terminal of the bias circuit 110.

In FIG. 1, the first terminal of the transistor M1 can be coupled to the system voltage terminal NV2 for receiving the system voltage V2. In this case, since the bias circuit 110 can receive the reference voltage Vref1 through the first impedance unit 120 and provide the steady bias voltage VB2 to the control terminal of the transistor M1 according to the reference voltage Vref1, the transistor M1 is able to provide the bias voltage required by the amplifier A1 stably.

In addition, in some embodiments of the present invention, the first impedance unit 120 can provide different impedances under different frequencies. Therefore, by selecting the first impedance unit 120 properly, the input impedance Zin1(f) looking into the second terminal of the transistor M1 can be adjusted according to the frequency of the RF signal SIG received by the input terminal of the amplifier A1. Consequently, when the frequency of the RF signal $SIG_{RF}$ changes, the first impedance unit 120 can also change the input impedance Zin1(f) looking into the second terminal of the transistor M1 correspondingly. Therefore, the degree of the RF signal $SIG_{RF}$ entering the first impedance unit 120 via the second end of the transistor M1 will vary with the frequency of the RF signal $SIG_{RF}$, thereby adjusting the bias voltages VB1 and VB2 dynamically, so that the bias device 100 can provide a stable bias voltage to maintain the linearity of amplifier A1.

In FIG. 1, the bias device 100 can further include a capacitor C1. The capacitor C1 has a first terminal coupled to the control terminal of the transistor M1, and a second terminal coupled to the system voltage terminal NV1 for receiving the system voltage V1. In some embodiments, the capacitor C1 can also be used to adjust the input impedance Zin1(f) looking into the second terminal of the transistor M1, and thus, the bias device 100 can be designed more flexibly. However, in some embodiments, if the first impedance unit 120 is enough to provide the proper impedance, the capacitor C1 can be omitted.

In FIG. 1, the bias circuit 110 can include a resistor 112 and diodes 114 and 116. The resistor 112 has a first terminal coupled to the first terminal of the bias circuit 110, and a second terminal coupled to the third terminal of the bias circuit 110. The diode 114 has a first terminal coupled to the second terminal of the resistor 112, and a second terminal. The diode 116 has a first terminal coupled to the second terminal of the diode 114, and a second terminal coupled to the second terminal of the bias circuit 110. In FIG. 1, the diodes 114 and 116 can be implemented by diode-connected transistors.

Figure 2:
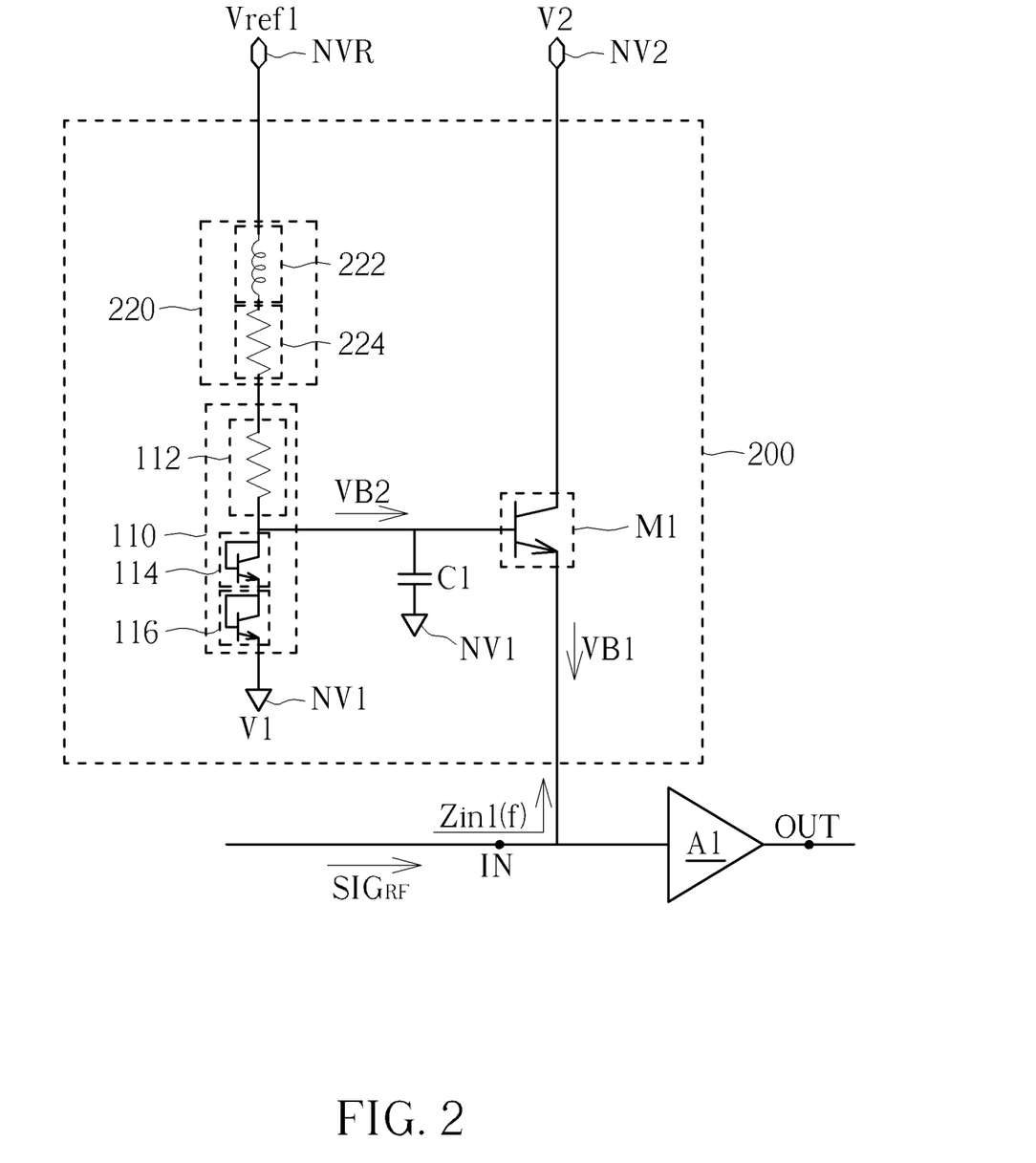
FIG. 2 shows a bias device according to another embodiment of the present invention.

Furthermore, in some embodiments, the first impedance unit 120 can include a microstrip line, an inductor, or a bonding wire. Also, in some embodiments, the inductor can be spiral inductor. However, the first impedance unit 120 is not limited to including the components aforementioned. FIG. 2 shows a bias circuit 200 according to one embodiment of the present invention. The bias circuit 200 and the bias circuit 100 have similar structures and can be operated with similar principles. However, in FIG. 2, the first impedance unit 220 can include an inductor 222 and a resistor 224 coupled in series.

Figure 3:
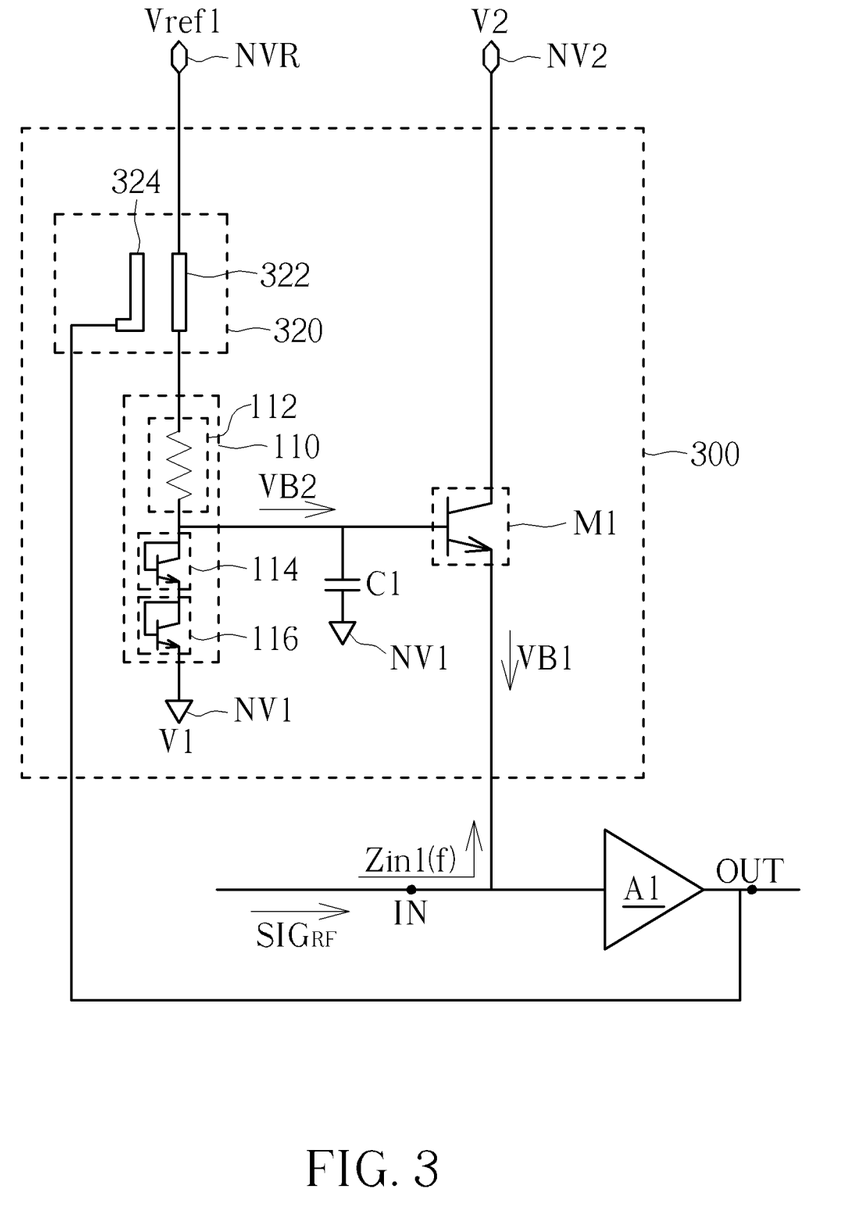
FIG. 3 shows a bias device according to another embodiment of the present invention.

FIG. 3 shows a bias circuit 300 according to one embodiment of the present invention. The bias circuit 300 and the bias circuit 100 have similar structures and can be operated with similar principles. However, in FIG. 3, the first impedance unit 320 can include a transmission line 322 and a coupler 324. The transmission line 322 has a first terminal coupled to the first terminal of the first impedance unit 320, a second terminal coupled to the second terminal of the first impedance unit 320. The coupler 324 has a first terminal coupled with the transmission line 322, and a second terminal coupled to the output terminal OUT of the amplifier A1. In some embodiments, the second terminal of the coupler 324 can be changed to be coupled to the input terminal IN of the amplifier A1 according to the system requirement.

Figure 4:
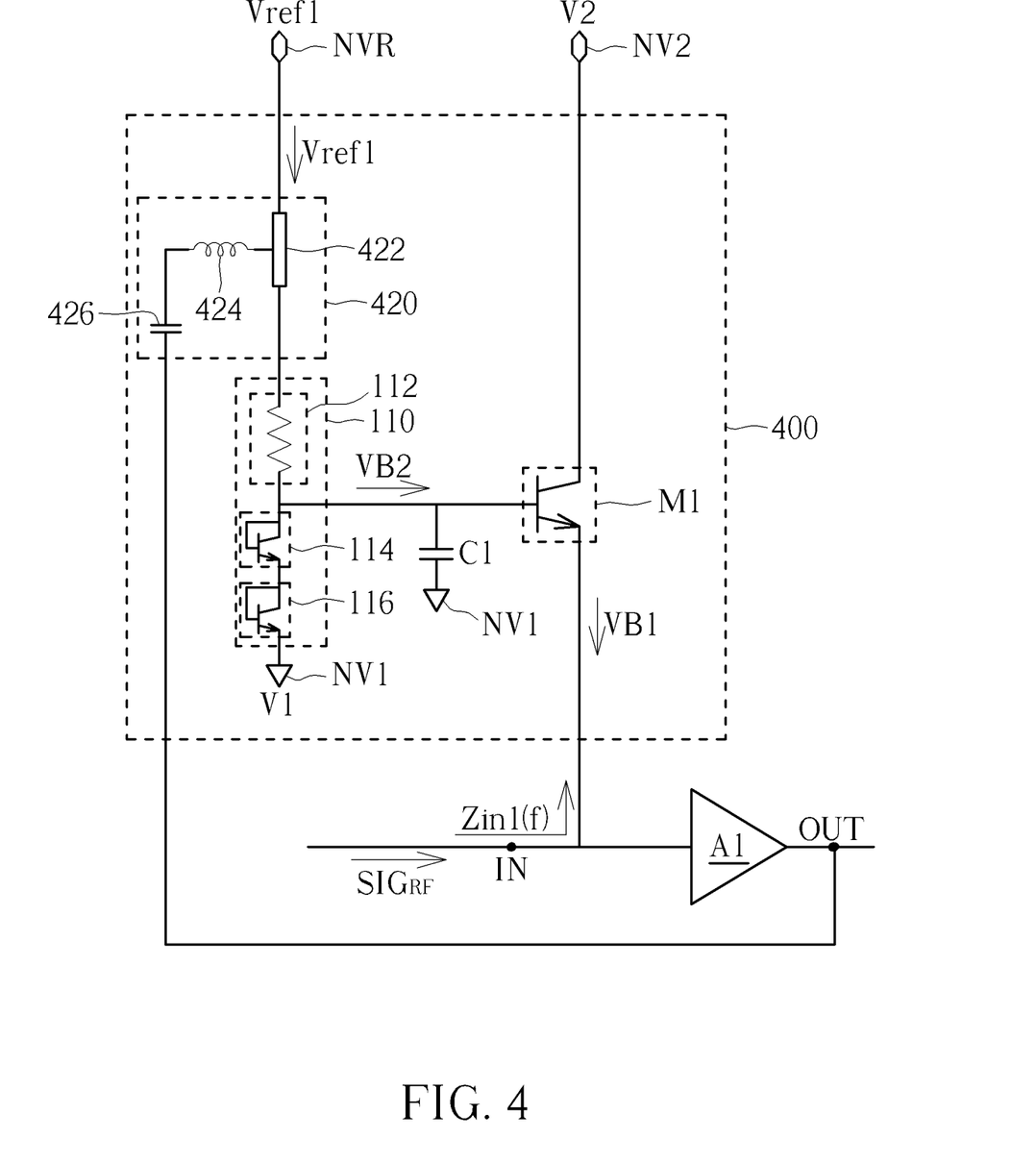
FIG. 4 shows a bias device according to another embodiment of the present invention.

FIG. 4 shows a bias circuit 400 according to one embodiment of the present invention. The bias circuit 400 and the bias circuit 100 have similar structures and can be operated with similar principles. However, in FIG. 4, the first impedance unit 420 can include a transmission line 422, an inductor 424, and a capacitor 426. The transmission line 422 has a first terminal coupled to the first terminal of the first impedance unit 420, and a second terminal coupled to the second terminal of the first impedance unit 420. The inductor 424 has a first terminal coupled to the transmission line 422, and a second terminal. The capacitor 426 has a first terminal coupled to the second terminal of the inductor 424, and a second terminal coupled to the output terminal OUT of the amplifier A1. In some embodiments, the second terminal of the capacitor 426 can be changed to be coupled to the input terminal IN of the amplifier A1 according to the system requirement.

Figure 5:
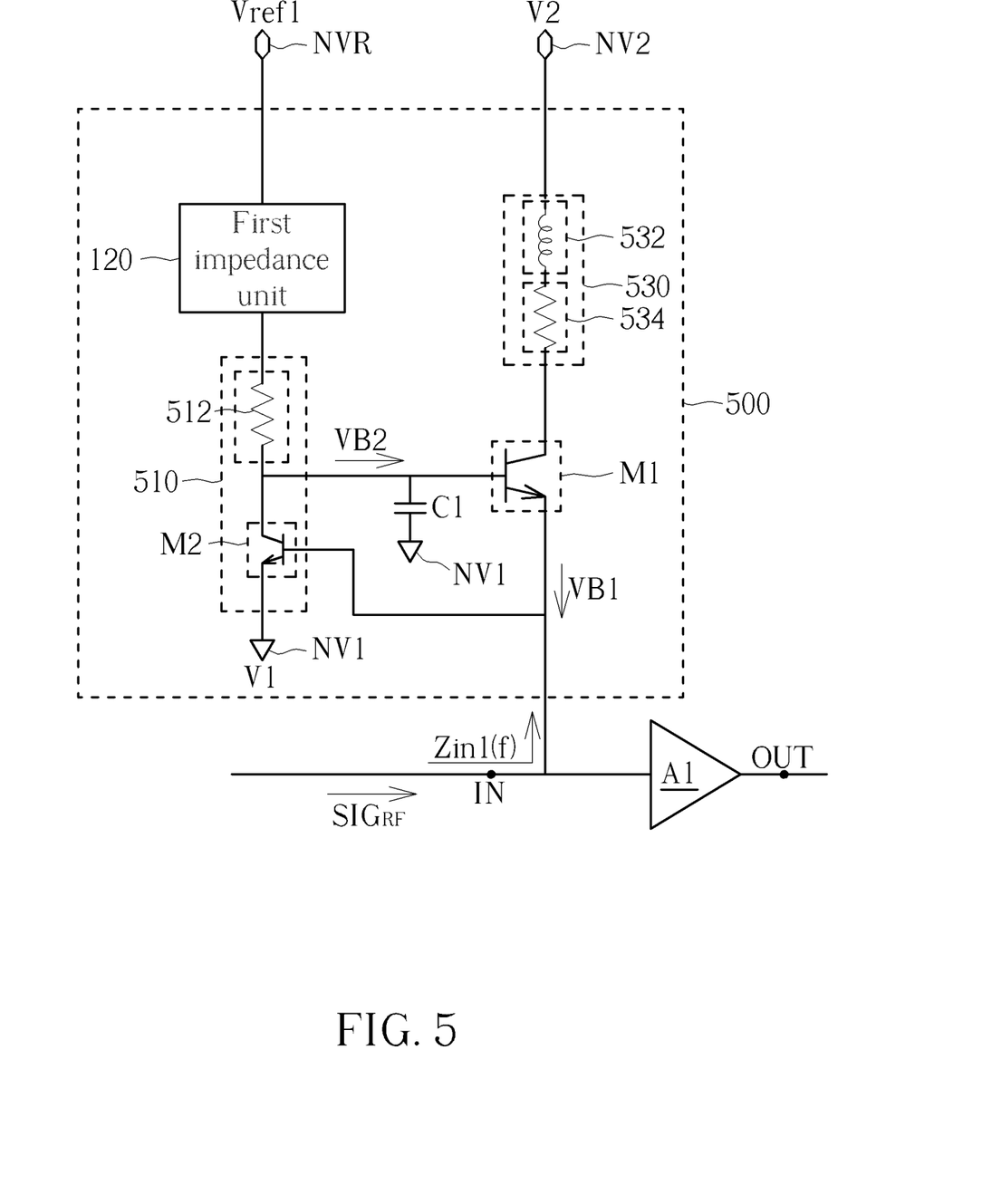
FIG. 5 shows a bias device according to another embodiment of the present invention.

FIG. 5 shows a bias circuit 500 according to one embodiment of the present invention. The bias circuit 500 and the bias circuit 100 have similar structures and can be operated with similar principles. However, in FIG. 5, the bias circuit 500 can further include a second impedance unit 530. The second impedance unit 530 has a first terminal coupled to the system voltage terminal NV2 for receiving the system voltage V2, and a second terminal coupled to the first terminal of the transistor M1. The second impedance unit 530 can also be used to adjust the input impedance Zin1(f) looking into the second terminal of the transistor M1 according to the frequency of the RF signal $SIG_{RF}$. That is, in FIG. 5, the bias circuit 500 can adjust the input impedance looking into the second terminal of the transistor M1 under different frequencies with both the first impedance unit 120 and the second impedance unit 530, ensuring the bias circuit 500 to provide the bias voltage stably under different frequencies for maintaining the linearity of the amplifier A1.

In FIG. 5, the second impedance unit 530 can include an inductor 532 and a resistor 534 coupled in series. However, in some embodiments, the second impedance unit 530 can be implemented by other components. For example, the second impedance unit 530 can include a microstrip, an inductor, or a bonding wire, and in some embodiments, the inductor can be spiral inductor.

Furthermore, in FIG. 5, the bias circuit 510 can include a resistor 512 and a transistor M2. The resistor 512 has a first terminal coupled to the first terminal of the bias circuit 510, and a second terminal coupled to the third terminal of the bias circuit 510. The transistor M2 has a first terminal coupled to the second terminal of the resistor 512, a second terminal coupled to the second terminal of the bias circuit 510, and a control terminal coupled to the second terminal of the transistor M1.

Figure 6:
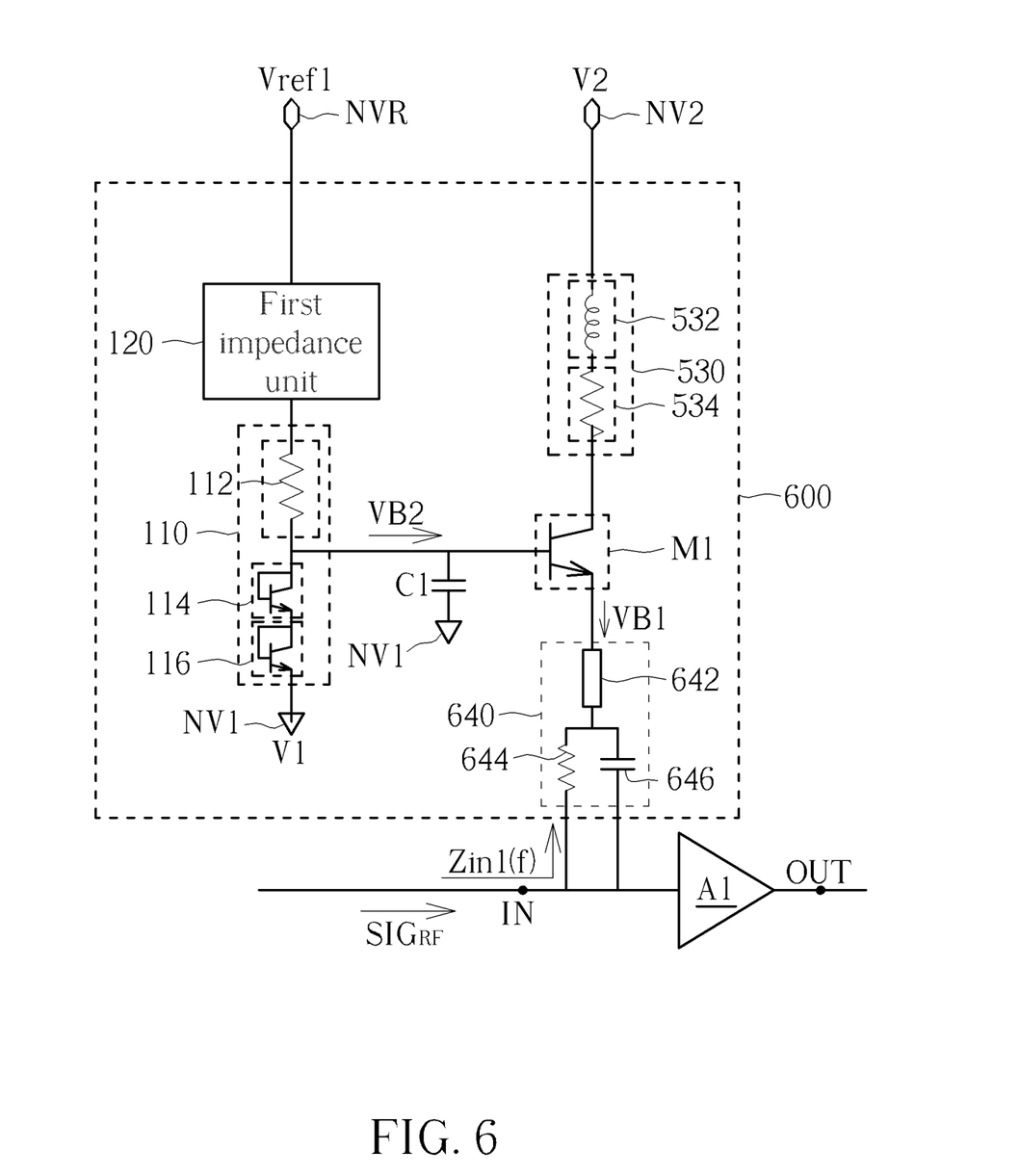
FIG. 6 shows a bias device according to another embodiment of the present invention.

FIG. 6 shows a bias circuit 600 according to one embodiment of the present invention. The bias circuit 600 and the bias circuit 500 have similar structures and can be operated with similar principles. However, in FIG. 6, the bias device 600 can include the bias circuit 110 and a third impedance unit 640. The third impedance unit 640 has a first terminal coupled to the second terminal of the transistor M1, and a second terminal coupled to the input terminal IN of the amplifier A1. In FIG. 6, the third impedance unit 640 can include a microstrip 642 and a resistor 644. The microstrip 642 and the resistor 644 can be coupled in series between the first terminal and the second terminal of the third impedance unit 640. Furthermore, in some embodiments, the third impedance unit 640 can further include a capacitor 646, and the capacitor 646 can be coupled in parallel with the resistor 644. However, in some embodiments, the third impedance unit 640 may omit the capacitor 646.

Figure 7:
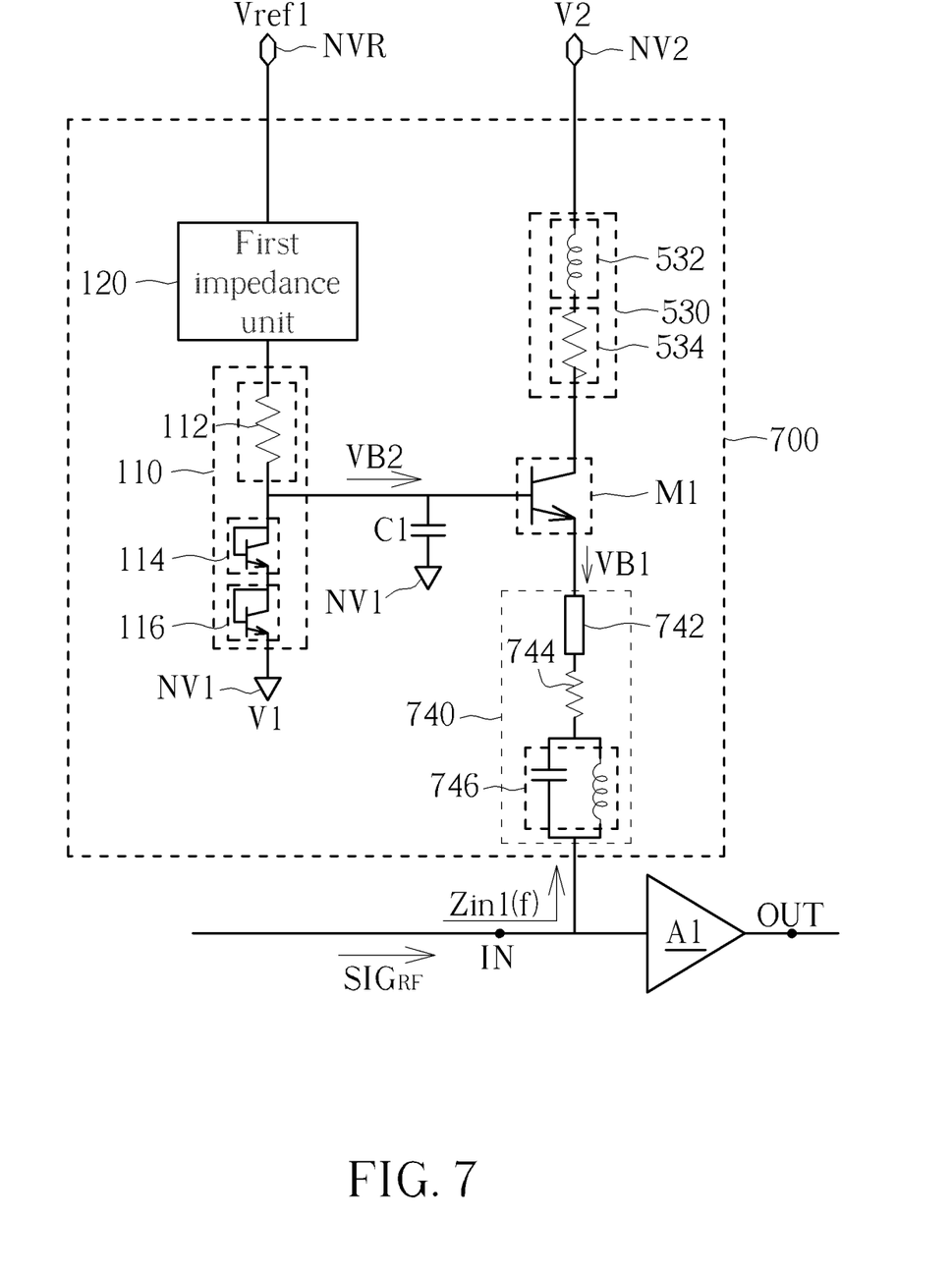
FIG. 7 shows a bias device according to another embodiment of the present invention.

FIG. 7 shows a bias circuit 700 according to one embodiment of the present invention. The bias circuit 700 and the bias circuit 600 have similar structures and can be operated with similar principles. However, in FIG. 7, the third impedance unit 740 can include a microstrip 742, a resistor 744, and an imaginary impedance unit 746. The imaginary impedance unit 746 can be coupled in series with the resistor 744 and the microstrip 742. In some embodiments, the imaginary impedance unit 746 can, for example, include an inductor and a capacitor coupled in parallel.

Figure 8:
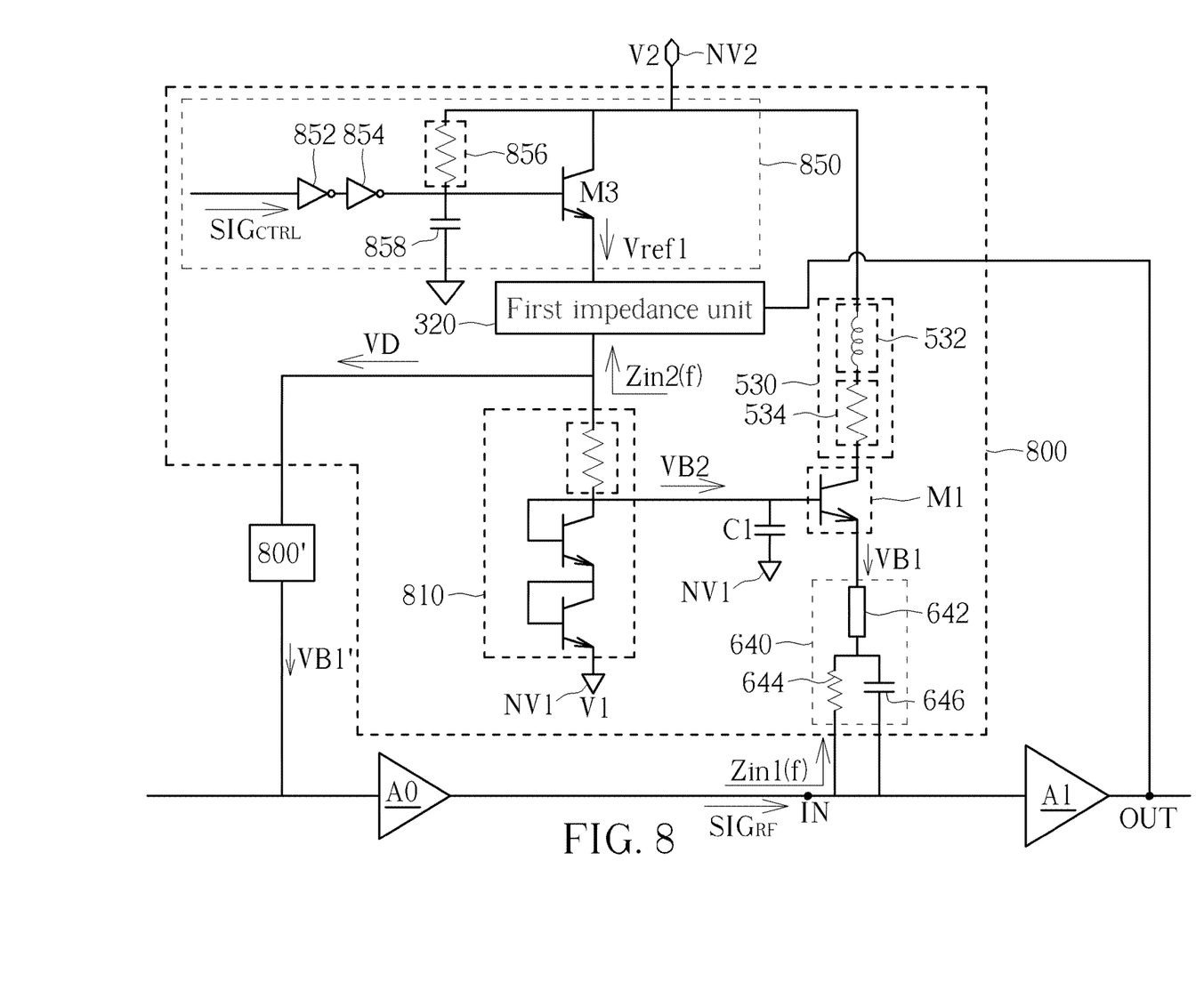
FIG. 8 shows a bias device according to another embodiment of the present invention.

FIG. 8 shows a bias circuit 800 according to one embodiment of the present invention. The bias circuit 800 and the bias circuit 600 have similar structures and can be operated with similar principles. However, in FIG. 8, the bias device 800 can further include a digital control circuit 850. The digital control circuit 850 includes a first terminal coupled to the system voltage terminal NV2 for receiving the system voltage V2, and a second terminal coupled to the first terminal of the first impedance unit 320. The digital control circuit 850 can output the reference voltage Vref1 to the first terminal of the first impedance unit 320 according to the digital control signal $SIG_{CTRL}$ to enable or disable the bias circuit 810.

In FIG. 8, the digital control circuit 850 can include inverters 852 and 854, a transistor M3, a resistor 856, and a capacitor 858. The inverter 852 has an input terminal for receiving the digital control signal $SIG_{CTRL}$, and an output terminal. The inverter 854 has an input terminal coupled to the output terminal of the inverter 852, and an output terminal. The transistor M3 has a first terminal coupled to the first terminal of the digital control circuit 850, a second terminal coupled to the second terminal of the digital control circuit 850, and a control terminal coupled to the output terminal of the inverter 854. The resistor 856 has a first terminal coupled to the first terminal of the transistor M3, and a second terminal coupled to the control terminal of the transistor M3. The capacitor 858 has a first terminal coupled to the control terminal of the transistor M3, and a second terminal coupled to the system voltage terminal NV1.

The bias device 800 cannot only adjust the input impedance $Zin1(f)$ looking into second terminal of the transistor M1 with the first impedance unit 320 and the second impedance unit 530, but also adjust the input impedance $Zin2(f)$ looking into the second terminal of the transistor M3 with the first impedance unit 320, so that the bias device 800 can provide the stable bias voltage adaptively under different frequencies, thereby maintaining the linearity of the amplifier A1.

In addition, since the first impedance unit 320 is coupled to the output terminal OUT of the amplifier A1, the detection voltage VD at the first terminal of the bias circuit 810 generated by the first impedance unit 320 according to the reference voltage Vref1 will be related to the output power of the amplifier A1. In this case, the transistor M3 of the bias device 800 can also be used as an RF signal power detector for detecting the power of the RF signal outputted by the amplifier A1, and can provide the detect voltage VD to the bias circuit of the bias device 800' corresponding to the amplifier A0 prior to the amplifier A1 so as to adjust the bias voltage generated by the bias device 800'. That is, the bias voltage VB1' received by the amplifier A0 of the prior stage can be adjusted adaptively according to the output power of the amplifier A1 and the frequency of the RF signal, thereby compensating the AM-AM loss and the AM-PM loss of the amplifier A1. Furthermore, in some embodiments, there may be more than two stages of amplifiers on the RF signal path. In this case, the detection voltage VD can be provided to the bias devices of other prior stages of amplifiers.

In some other embodiments, the bias device 800 can also use other structures or components to implement the first impedance unit 320. However, as long as the detection voltage VD generated by the first impedance unit 320 is related to the output power of the amplifier A1, the bias device 800 would still provide the detection voltage VD to the bias devices of the prior stages of amplifiers for adjusting the bias voltages received by the prior stages of amplifiers. For example, in FIG. 4, the first impedance unit 420 can also be coupled to the output terminal OUT of the amplifier A1; therefore, when the first impedance unit 420 is used to replace the first impedance unit 320 in the bias device 800, the detection voltage VD provided by the impedance unit 420 to the first terminal of the bias circuit 810 is also related to the output power of the amplifier A1. Consequently, the detection voltage VD can still be provided to the bias device 800' corresponding to the amplifier A0 prior to the amplifier A1 so as to adjust the bias voltage VB1' received by the amplifier A0.

Figure 9:
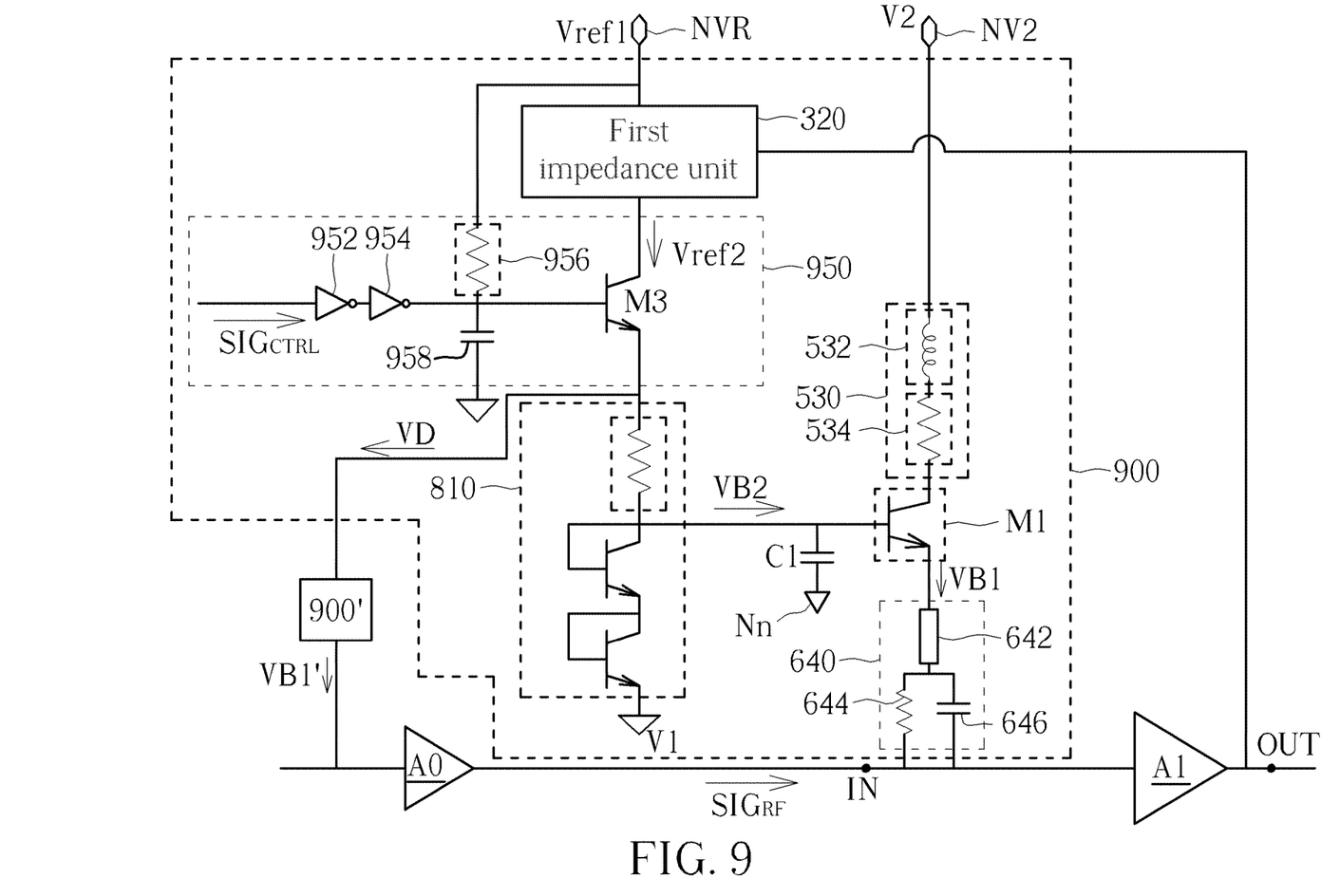
FIG. 9 shows a bias device according to another embodiment of the present invention.

In FIG. 8, the digital control circuit 850 is coupled between the system voltage terminal NV2 and the first impedance unit 320. However, in some embodiments, the digital control circuit 850 can also be coupled between the first impedance unit 320 and the bias circuit 810. FIG. 9 shows a bias circuit 900 according to one embodiment of the present invention. The bias circuit 900 and the bias circuit 800 have similar structures and can be operated with similar principles. For example, the digital control circuit 950 can also include the inverters 952 and 954, the transistor M3, the resistor 956, and the capacitor 958. However, in FIG. 9, the first terminal of the digital control circuit 950 can be coupled to the second terminal of the first impedance unit 320 for receiving the reference voltage Vref2, the second terminal of the digital control circuit 950 can be coupled to the bias circuit 810, and the first terminal of the first impedance unit 320 can be coupled to the reference voltage terminal NVR for receiving the reference voltage Vref1. In some embodiments, the reference voltage Vref1 can be substantially equal to the system voltage V2, and the reference voltage terminal NVR can be substantially connected to the system voltage terminal NV2. In this case, the digital control circuit 950 can output the reference voltage Vref2 to the bias circuit 810 according to the digital control signal $SIG_{CTRL}$ for enabling or disabling the bias circuit 810, and the main purposes of the present invention can still achieved.

Furthermore, since the first impedance unit 320 can be coupled to the output terminal OUT of the amplifier A1, the detection voltage VD generated by the digital control circuit 950 according to the reference voltage Vref2 will be related to the output power of the amplifier A1. In this case, in addition to the first terminal of the bias circuit 810, the detection voltage VD can also be provided to the bias circuit of the bias device 900' corresponding to the amplifier A0 prior to the amplifier A1 for providing the bias voltage generated by the bias device 900'. That is, the bias voltage VB1' received by the amplifier A0 of the prior stage can be adjusted adaptively according to the output power of the amplifier A1 and the frequency of the RF signal, thereby compensating the AM-AM loss and the AM-PM loss of the amplifier A1. Furthermore, in some embodiments, there may be more than two stages of amplifiers on the RF signal path. In this case, the detection voltage VD can be provided to the bias devices of other prior stages of amplifiers.

In some embodiments, the bias device 900 can use other structures or components to implement the first impedance unit 320. However, as long as the detection voltage VD generated by the first impedance unit 320 is related to the output power of the amplifier A1, the bias device 900 would still provide the detection voltage VD to the bias devices of the prior stages of amplifiers for adjusting the bias voltages received by the prior stages of amplifiers. For example, when the first impedance unit 420 in FIG. 4 is used to replace the first impedance unit 320, the detection voltage VD provided by the impedance unit 420 to the first terminal of the bias circuit 810 is also related to the output power of the amplifier A1. Consequently, the detection voltage VD can still be provided to the bias circuit in the bias device 900' corresponding to the amplifier A0 prior to the amplifier A1 so as to adjust the bias voltage VB1' received by the amplifier A0 and compensate the AM-AM loss and the AM-PM loss of the amplifier A1.

Figure 10:
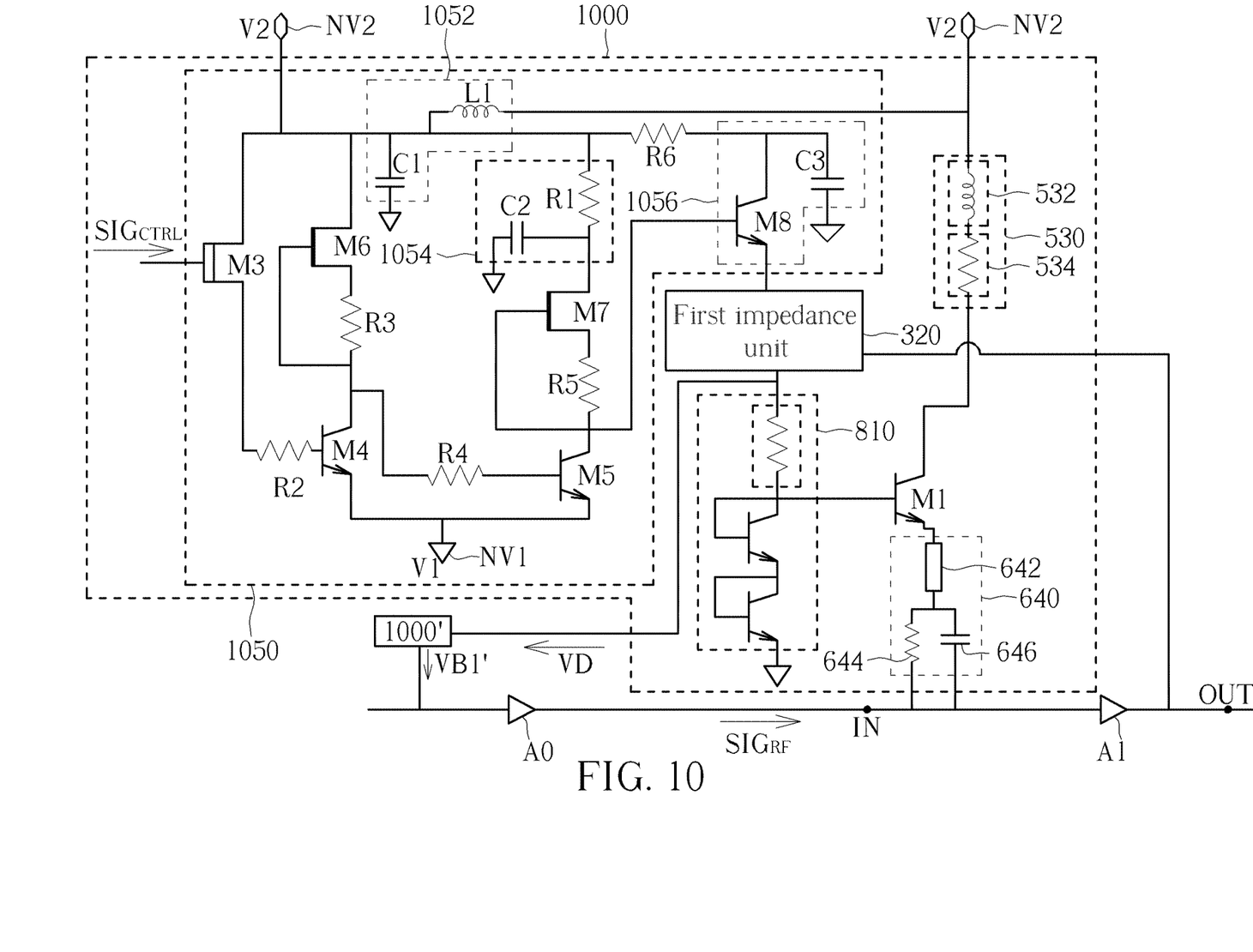
FIG. 10 shows a bias device according to another embodiment of the present invention.

In addition, the digital control circuit of the present invention is not limited to the digital control circuit 850 shown in FIG. 8. In some other embodiments, the digital control circuits 850 and 950 can be implemented with other structures or components. FIG. 10 shows a bias circuit 1000 according to one embodiment of the present invention. The bias circuit 1000 and the bias circuit 800 have similar structures and can be operated with similar principles. However, in FIG. 10, the digital control circuit 1050 can include the transistors M3, M4, M5, M6, and M7, the low pass filters 1052 and 1054, and the voltage follower 1056.

The transistor M3 has a first terminal, a second terminal, and a control terminal for receiving the digital control signal $SIG_{CTRL}$. The transistor M4 has a first terminal, a second terminal coupled to the system voltage terminal NV1, and a control terminal coupled to the second terminal of the transistor M3. The transistor M5 has a first terminal, a second terminal coupled to the system voltage terminal NV1, and a control terminal coupled to the first terminal of the transistor M4 through the resistor R4. The transistor M6 has a first terminal coupled to the first terminal of the transistor M3, a second terminal coupled to the first terminal of the transistor M4 through the resistor R3, and a control terminal coupled to the second terminal of the transistor M6 through the resistor R3. The transistor M7 has a first terminal, a second terminal coupled to the first terminal of the transistor M5 through the resistor R5, and a control terminal coupled to the second terminal of the transistor M7 through the resistor R5.

The low pass filter 1052 has a first terminal coupled to the first terminal of the digital control circuit 1050, and a second terminal coupled to the first terminal of the transistor M3. The low pass filter 1054 has a first terminal coupled to the second terminal of the low pass filter 1052, and a second terminal coupled to the first terminal of the transistor M7.

The voltage follower 1056 has a first terminal coupled to the second terminal of the low pass filter 1052, a second terminal coupled to the first terminal of the transistor M5, and a third terminal coupled to the second terminal of the digital control circuit 1050.

In FIG. 10, the low pass filter 1052 can include an inductor L1 and a capacitor C1. The inductor L1 has a first terminal coupled to the first terminal of the low pass filter 1052, and a second terminal coupled to the second terminal of the low pass filter 1052. The capacitor C1 has a first terminal coupled to the second terminal of the low pass filter 1052, and a second terminal coupled to the system voltage terminal NV1.

Furthermore, the low pass filter 1054 can include a resistor R1 and a capacitor C2. The resistor R1 has a first terminal coupled to the first terminal of the low pass filter 1054, and a second terminal coupled to the second terminal of the low pass filter 1054. The capacitor C2 has a first terminal coupled to the second terminal of the low pass filter 1054, and a second terminal coupled to the system voltage terminal NV1.

In addition, the voltage follower 1056 can include a transistor M8 and a capacitor C3. The transistor M8 has a first terminal coupled to the first terminal of the voltage follower 1056, a second terminal coupled to the third terminal of the voltage follower 1056, and a control terminal coupled to the second terminal of the voltage follower 1056. The capacitor C3 has a first terminal coupled to the first terminal of the voltage follower 1056, and a second terminal coupled to the system voltage terminal NV1.

Also, the digital control circuit 1050 can further include the resistors R2 to R6. In FIG. 10, the resistor R2 can be coupled between the second terminal of the transistor M3 and the control terminal of the transistor M4, the resistor R3 can be coupled between the second terminal of the transistor M6 and the first terminal of the transistor M4, and the resistor R4 can be coupled between the first terminal of the transistor M4 and the control terminal of the transistor M5. The resistor R5 can be coupled between the second terminal of the transistor M7 and the first terminal of the transistor M5, and the resistor R6 can be coupled between the low pass filter 1054 and the first terminal of the transistor M8.

In FIG. 10, the first impedance unit 320 can provide the detection voltage VD to the first terminal of the bias circuit 810 according to the reference voltage generated by the digital control circuit 1050, and the detection voltage VD can also be provided to the bias device 1000' corresponding to the amplifier A0 of a prior stage for adjusting the bias voltage VB1' received by the amplifier A0. In some embodiments, the bias circuit 1000 can also use other structures or components to implement the first impedance unit 320. However, as long as the detection voltage VD is related to the output power of the amplifier A1, the bias device 1000 would still be able to provide the detection voltage VD to the bias devices of the prior stages of amplifiers for adjusting the bias voltages received by the prior stages of amplifiers. For example, when the first impedance unit 320 is replaced by the first impedance unit 420 as shown in FIG. 4, the digital control circuit 1050 can still provide the detection voltage VD generated by the impedance unit 420 to the first terminal of the bias circuit 810, and also provide the detection voltage VD to the bias device 1000' corresponding to the amplifier A0, thereby adjusting the bias voltage received by the amplifier A0 and compensating the AM-AM loss and the AM-PM loss of the amplifier A1.

In summary, the bias devices provided by the embodiments of the present invention can adjust the input impedance of the transistors used to provide the bias voltages so as to maintain the linearity of the amplifiers even when the frequencies of the input RF signals received by the amplifiers are changed. Also, the AM-AM loss and the AM-PM loss of the amplifiers can be compensated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bias device comprising:
    a first transistor having a first terminal, a second terminal configured to provide a first bias voltage to an input terminal of an amplifier, and a control terminal;
    a bias circuit having a first terminal, a second terminal coupled to a first system voltage terminal for receiving a first system voltage, and a third terminal coupled to the control terminal of the first transistor for providing a second bias voltage to the control terminal of the first transistor;
    a first impedance unit having a first terminal configured to receive a first reference voltage, and a second terminal coupled to the first terminal of the bias circuit, the first impedance unit being configured to adjust an input impedance looking into the second terminal of the first transistor according to a frequency of a radio frequency signal received from the input terminal of the amplifier; and
    a second impedance unit having a first terminal coupled to a second system voltage terminal for receiving a second system voltage, and a second terminal coupled to the first terminal of the first transistor, the second impedance unit being configured to adjust the input impedance looking into the second terminal of the first transistor according to the frequency of the radio frequency signal.

2. The bias device of claim 1, wherein the first impedance unit adjusts the input impedance according to the frequency of the radio frequency signal received from the input terminal of the amplifier to maintain linearity of the amplifier.

3. The bias device of claim 1, wherein the second impedance unit comprises a microstrip, a first inductor, a bonding wire, or a second inductor and a resistor coupled in series.

4. The bias device of claim 3, wherein the first inductor or the second inductor is a spiral inductor.

5. The bias device of claim 1, wherein the bias circuit comprises:
a resistor having a first terminal coupled to the first terminal of the bias circuit, and a second terminal coupled to the third terminal of the bias circuit;
a first diode having a first terminal coupled to the second terminal of the resistor, and a second terminal; and
a second diode having a first terminal coupled to the second terminal of the first diode, and a second terminal coupled to the second terminal of the bias circuit.

6. The bias device of claim 1, wherein the bias circuit comprises:
a resistor having a first terminal coupled to the first terminal of the bias circuit, and a second terminal coupled to the third terminal of the bias circuit; and
a second transistor having a first terminal coupled to the second terminal of the resistor, a second terminal coupled to the second terminal of the bias circuit, and a control terminal coupled to the second terminal of the first transistor.

7. The bias device of claim 1, further comprising:
a capacitor having a first terminal coupled to the control terminal of the first transistor, and a second terminal coupled to the first system voltage terminal for receiving the first system voltage.

8. The bias device of claim 1, further comprising:
a third impedance unit having a first terminal coupled to the second terminal of the first transistor, and a second terminal coupled to the input terminal of the amplifier.

9. The bias device of claim 8, wherein the third impedance unit comprises:
a microstrip and a resistor coupled in series between the first terminal and the second terminal of the third impedance unit.

10. The bias device of claim 9, wherein the third impedance unit further comprises:
a capacitor coupled in parallel with the resistor.

11. The bias device of claim 9, wherein the third impedance unit further comprises:
an imaginary impedance unit coupled in series with the resistor and the microstrip, and the imaginary impedance unit comprises a capacitor and an inductor coupled in parallel.

12. A bias device comprising:
a first transistor having a first terminal, a second terminal configured to provide a first bias voltage to an input terminal of an amplifier, and a control terminal;
a bias circuit having a first terminal, a second terminal coupled to a first system voltage terminal for receiving a first system voltage, and a third terminal coupled to the control terminal of the first transistor for providing a second bias voltage to the control terminal of the first transistor; and
a first impedance unit having a first terminal configured to receive a first reference voltage, and a second terminal coupled to the first terminal of the bias circuit, the first impedance unit being configured to adjust an input impedance looking into the second terminal of the first transistor according to a frequency of a radio frequency signal received from the input terminal of the amplifier; and
a digital control circuit having a first terminal and a second terminal;
wherein the first terminal of the digital control circuit is coupled to a second system voltage terminal for receiving a second system voltage, the second terminal of the digital control circuit is coupled to the first terminal of the first impedance unit, and the digital control circuit is configured to output the first reference voltage to the first terminal of the first impedance unit to enable or disable the bias circuit according to a digital control signal; or
wherein the first terminal of the digital control circuit is coupled to the second terminal of the first impedance unit for receiving a second reference voltage, and the second terminal of the digital control circuit is coupled to the bias circuit, the digital control circuit is configured to output the second reference voltage to the bias circuit to enable or disable the bias circuit according to the digital control signal, and the first terminal of the first impedance unit is coupled to a reference voltage terminal for receiving the first reference voltage.

13. The bias device of claim 12, wherein the digital control circuit comprises:
a first inverter having an input terminal configured to receive the digital control signal, and an output terminal;
a second inverter having an input terminal coupled to the output terminal of the first inverter, and an output terminal;
a third transistor having a first terminal coupled to the first terminal of the digital control circuit, a second terminal coupled to the second terminal of the digital control circuit, and a control terminal coupled to the output terminal of the second inverter;
a resistor having a first terminal coupled to the first terminal of the third transistor, and a second terminal coupled to the control terminal of the third transistor; and
a capacitor having a first terminal coupled to the control terminal of the third transistor, and a second terminal coupled to the first system voltage terminal.

14. The bias device of claim 12, wherein:
the first terminal of the bias circuit is configured to receive a detection voltage generated by the first impedance unit or the digital control circuit; and
the detection voltage is further provided to a bias device corresponding to a prior stage of amplifier disposed on a same radio frequency signal path of the amplifier.

15. A bias device comprising:
a first transistor having a first terminal, a second terminal configured to provide a first bias voltage to an input terminal of an amplifier, and a control terminal;
a bias circuit having a first terminal, a second terminal coupled to a first system voltage terminal for receiving a first system voltage, and a third terminal coupled to the control terminal of the first transistor for providing a second bias voltage to the control terminal of the first transistor; and
a first impedance unit having a first terminal configured to receive a first reference voltage, and a second terminal coupled to the first terminal of the bias circuit, the first impedance unit being configured to adjust an input impedance looking into the second terminal of the first transistor according to a frequency of a radio frequency signal received from the input terminal of the amplifier;

wherein the first impedance unit comprises a microstrip, a first inductor, a bonding wire, or a second inductor and a resistor coupled in series; or wherein the first impedance unit comprises a first transmission line and a coupling component, the first transmission line has a first terminal coupled to the first terminal of the first impedance unit and a second terminal coupled to the second terminal of the first impedance unit, and the coupling component has a first terminal coupled with the first transmission line, and a second terminal coupled to the input terminal of the amplifier or an output terminal of the amplifier; or wherein the first impedance unit comprises a second transmission line, a third inductor and a capacitor, the second transmission line has a first terminal coupled to the first terminal of the first impedance unit and a second terminal coupled to the second terminal of the first impedance unit; the third inductor has a first terminal coupled to the second transmission line, and the capacitor has a first terminal coupled to a second terminal of the third inductor and a second terminal coupled to the input terminal of the amplifier or an output terminal of the amplifier.

16. The bias device of claim 15, wherein the first inductor, the second inductor, or the third inductor is a spiral inductor.

\* \* \* \* \*